United States Patent [19]
Ker et al.

[11] Patent Number: 5,838,050
[45] Date of Patent: Nov. 17, 1998

[54] HEXAGON CMOS DEVICE

[75] Inventors: Ming-Dou Ker, Tainan Hsien; Chung-Yu Wu, Hsinchu; Chien-Chang Huang, Changhua Hsien; Chau-Neng Wu, Kaohsiung Hsien; Ta-Lee Yu, Hsinchu Hsien, all of Taiwan

[73] Assignee: Winbond Electronics Corp., Hsinchu, Taiwan

[21] Appl. No.: 932,010

[22] Filed: Sep. 17, 1997

Related U.S. Application Data

[63] Continuation of Ser. No. 665,853, Jun. 19, 1996, abandoned.
[51] Int. Cl.⁶ .................................................. H01L 27/72
[52] U.S. Cl. ....................... 257/401; 257/351; 257/357; 257/377; 257/382; 257/401; 257/409
[58] Field of Search .................................. 257/351, 357, 257/377, 382, 401, 409

[56] References Cited

U.S. PATENT DOCUMENTS

| | | | |
|---|---|---|---|
| 4,680,853 | 7/1987 | Lidow et al. | 438/268 |
| 4,777,521 | 10/1988 | Coe | 257/409 |
| 5,040,034 | 8/1991 | Murakami et al. | 257/330 |
| 5,072,266 | 12/1991 | Bulucea et al. | 257/409 |
| 5,095,343 | 3/1992 | Klodzinski et al. | 257/409 |
| 5,192,989 | 3/1993 | Matsushita et al. | 257/401 |
| 5,218,222 | 6/1993 | Roberts . | |
| 5,270,565 | 12/1993 | Lee et al. . | |
| 5,323,036 | 6/1994 | Neilson et al. | 257/287 |
| 5,404,041 | 4/1995 | Diaz et al. . | |
| 5,406,104 | 4/1995 | Hirota et al. | 257/401 |
| 5,635,742 | 6/1997 | Hoshi et al. | 257/401 |
| 5,656,850 | 8/1997 | Kapoor | 257/401 |

FOREIGN PATENT DOCUMENTS

| | | | |
|---|---|---|---|
| 0 434 234 A2 | 6/1991 | European Pat. Off. . | |
| 357012553 | 1/1982 | Japan | 257/401 |
| 57-37875 | 3/1982 | Japan . | |
| 61-283157 | 12/1986 | Japan . | |

Primary Examiner—Edward Wojciechowicz
Attorney, Agent, or Firm—Fish & Richardson P.C.

[57] ABSTRACT

A CMOS device containing a plurality of hexagon cells over a semiconductor substrate is disclosed. Each hexagon cell includes a hexagonal ring gate, a drain diffusion region and a source diffusion region. The hexagonal ring gate is made of conducting materials and a dielectric layer over the substrate, therefore defining a channel region in the substrate between the gate and the substrate. The entire drain diffusion region in the substrate is enclosed by the hexagonal ring gate. The source diffusion region surrounds the hexagonal ring gate in the substrate. Each hexagon cell further provides a drain contact in the center of the drain diffusion region. A plurality of source contacts are arranged around the ring gate over the substrate. The hexagon cells of a unique hexagon device are surrounded by a first guard ring and a second guard ring. The hexagon device can be used as a CMOS output buffer or input ESD protection circuit to reduce the layout area of an integrated circuit.

10 Claims, 11 Drawing Sheets

HEXAGON CMOS DEVICE

This is a continuation of application Ser. No. 08/665,853, filed Jun. 19, 1996, now abandoned.

BACKGROUND OF THE INVENTION

1. Field of the Invention

The present invention relates to a complementary metal-oxide-semiconductor (CMOS) device, and more specifically, to a CMOS device with a hexagonal device configuration.

2. Description of the Prior Art

As CMOS technology is scaled down to submicron dimensions, advanced processes, for example, those that provide thinner gate oxides, shorter channel lengths, shallower source/drain junctions, lightly-doped drain (LDD) regions, and silicided diffusion, greatly degrade the electrostatic discharge (ESD) robustness of the protection devices in submicron CMOS ICs. In order to attain acceptable ESD robustness, the protection devices in submicron CMOS ESD protection circuits have to be designed with much larger dimensions than those in traditional long-channel CMOS technology. For example, the last stage of a CMOS output buffer may include NMOS and PMOS devices which are directly connected to an output pad of the buffer. In order to provide CMOS output buffers with enough driving/sinking capability to drive heavy output loads, the device dimensions, such as width/length (W/L) ratios, of these NMOS and PMOS devices are generally enlarged up to several hundred times. Moreover, the layout areas of CMOS output buffers in low-voltage applications are considerably increased to provide sufficient driving/sinking capability. However, submicron CMOS ICs in high-integration applications may have pin counts exceeding 200. In such high-pin-count submicron CMOS ICs, the pad pitch is reduced to around 100 $\mu$m. The layout area available for each input (or output) pad with an ESD protection circuit (or output buffer) including latchup guard rings is also seriously limited. Even if a traditional finger-type layout style is adopted to draw large-dimension NMOS and PMOS devices, the total layout area of input or output pads with ESD protection circuits, output buffers, and latchup guard rings would still have to be reduced in submicron CMOS ICs.

Several articles have been written which address the aforementioned problems. For example, Baker et al (1989 EOS/ESD Symp. Proc., EOS-11, pp. 175–181) proposed a waffle layout style to enhance the ESD robustness of an NMOS output transistor. The waffle layout style is shown to offer better ESD protection capability than in a finger-type layout style within the same layout area. Vemuru (Electronics Letters Vol.28, No.25), also confirmed that a waffle-type layout requires about 10% less area than a finger-type layout. Moreover, the waffle-type layout produces lower gate resistance suitable for wide-band or low-noise applications.

Recently, the relationships between layout parameters and ESD robustness in thin-oxide NMOS or PMOS devices of submicron CMOS technologies have been investigated. It was found that the spacing between the drain contact and the edge of gate oxide is an important ESD protection parameter for thin-oxide devices. For example, Danied et al (EOS/ESD Symp. Proc., EOS-12, pp.206–213) and Diaz et al (U.S. Pat. No. 5,404,041) both confirm this. Both of these references indicate that a larger spacing from the drain contact to the gate-oxide edge leads to higher ESD capability. The minimum spacing was found to be about 5–6 $\mu$m in submicron CMOS technologies to sustain better ESD protection without significantly increasing the layout area. With this spacing constraint in the waffle-style layout, while the spacing between the drain contact and the gate-oxide edge and the spacing between the source contact and the gate-oxide edge are the same, more layout area is occupied than the traditional finger-type style with the same W/L ratio.

Other references discuss enhancing the ESD robustness of output buffers. For example, U.S. Pat. No. 5,218,222 discloses a polysilicon resistor inserted between the output buffer and output pad with an additional lateral n-p-n bipolar transistor in shunt with the NMOS device to ground. U.S. Pat. No. 5,270,565 discloses an extended resistive structure as the drain of the NMOS device in the CMOS output buffer with an additional thick oxide device in shunt with the NMOS device to ground. These additional resistors, lateral bipolar transistors, or thick-oxide devices contribute extra RC time delay to the path from the output buffer to the pad. Although the ESD protection may be enhanced, the output driving/sinking capability and timing may no , longer meet the original design specifications.

Referring to FIG. 1, a conventional finger-type layout of an NMOS device is illustrated. The NMOS device includes four small NMOS transistors which are connected in parallel. The finger-type layout contains four parallel fingers of polysilicon gates 11 each lying between a drain region 12 and a source region 13. The number of fingers depends on the device dimensions. A number of contacts 12a and 13a are formed over drain regions 12 and source regions 13, respectively. The spacing from drain contacts 12a to polysilicon gates 11 is d, while that from source contacts 13a to polysilicon gate 11 is s. For better ESD robustness of the CMOS output buffer in submicron CMOS technologies, the value of d is preferably about 5–6 $\mu$m. Since the value of s has very few effects on the ESD reliability of the CMOS buffer, a preferred value of about 1 $\mu$m is often used in the device layout. In order to prevent latchup, two guard rings 16 and 17 are formed around the four NMOS transistors.

A cross-sectional view of the finger-type NMOS device along line 2—2 of FIG. 1 is illustrated in FIG. 2. As shown in the figure, drain regions 12 and source regions 13 are all n-type diffusion regions in a p-type silicon substrate 10. Guard ring 16 is a p-type diffusion region which is grounded. Another guard ring 17, which is an n-type diffusion region is connected to voltage source VDD as a dummy collector to prevent CMOS latchup. The latchup is caused by external overshooting/undershooting voltage waveforms which can trigger on the parasitic p-n-p-n path in CMOS ICs. In a CMOS output buffer directly connected to the output pad of the CMOS device, double guard rings for the NMOS and PMOS devices are often specified in the design rules of CMOS technologies to prevent CMOS latchup. As shown in FIG. 1 and FIG. 2, the spacing for suitable latchup guard rings 16 and 17 is S1 which is process dependent and should be specified in the design rule.

However, referring to the finger-type layout in FIG. 1, there is an important spacing S2 which often degrades the ESD robustness of the CMOS output buffer. In order to explain the importance of spacing S2, a cross-sectional view taken along line 3—3 of FIG. 1 is illustrated in FIG. 3. Referring to the figure, a parasitic diode D1 between p-type diffusion region 16 and n-type diffusion region 12 exists in substrate 10. If the spacing between diffusion regions 16 and 12, i.e., spacing S2, is too small, diode D1 will break down and bypass ESD current produced by a positive ESD voltage occurring on the output pad before the NMOS drain breaks down. Since the drain edge parallel to guard ring 16 is shorter than the edge parallel to source region 13, diode D1 is vulnerable to ESD stress if S2 is too small. Therefore, in considering ESD reliability, spacing S2 should be greater than the spacing between the edge of drain-contact 12a and the edge of source-contact 13a. With a larger spacing S2, drain region 12 will break down to bypass the ESD current from drain region 12 to source region 13 rather than through diode D1. Thus, the ESD robustness of the NMOS device in the output buffer will not be degraded by the parasitic diode D1. However, the total layout area of the device is increased.

Therefore, an important issue in the fabrication of CMOS ICs is how to reduce the layout area without affecting the ESD reliability.

SUMMARY OF THE INVENTION

Accordingly, the present invention provides a CMOS device including thin-oxide NMOS and PMOS transistors with a reduced layout area and enhanced ESD reliability.

The CMOS device of the present invention provides enhanced ESD protection capability in a smaller layout area and can be utilized in CMOS output buffers to drive/sink an external heavy load. The CMOS device contains a plurality of small-dimension NMOS (or PMOS) transistors functioning as cells and having a polygonal (e.g., hexagonal) configuration. A CMOS output buffer composed of the polygonal cells provides acceptable ESD protection capability while only requiring 60–80% of the layout area required by a conventional finger-type device. Moreover, since no additional elements, such as resistors, bipolar transistors, or thick-oxide devices, need to be introduced to the hexagon device, the layout area can be substantially reduced.

The CMOS device contains cells which are formed over a semiconductor substrate. Each cell includes a ring gate having a polygonal shape (e.g., hexagonal), a drain diffusion region and a source diffusion region. The ring gate is made of conducting materials formed over the substrate, therefore defining a channel region in the substrate through a dielectric layer between the gate and the substrate. The entire drain diffusion region in the substrate is enclosed by the ring gate and connected to the channel region. The source diffusion region encircles and is connected to the channel region in the substrate. Each cell further includes a drain contact in the center of the drain diffusion region (i.e., the center of the cell) for interconnection with the drain diffusion region. A plurality of source contacts are provided abound the ring gate over the substrate for interconnection with the source diffusion region. All of the cells belonging to the CMOS device are surrounded by a first guard ring and a second guard ring. These guard rings are concentric diffusion regions in the substrate.

The CMOS device can be used as a CMOS output buffer or an input ESD protection circuit to reduce the layout area of the integrated circuit. Moreover, the CMOS device of the present invention can be fabricated by any CMOS or BiCMOS technology to further reduce the layout area of the integrated circuit and manufacturing costs.

BRIEF DESCRIPTION OF THE DRAWINGS

Other objects, features, and advantages of the present invention will become apparent from the following detailed description of the preferred but non-limiting embodiment. The description is made with reference to the accompanying drawings, in which.

DETAILED DESCRIPTION OF THE INVENTION

Figure 1:
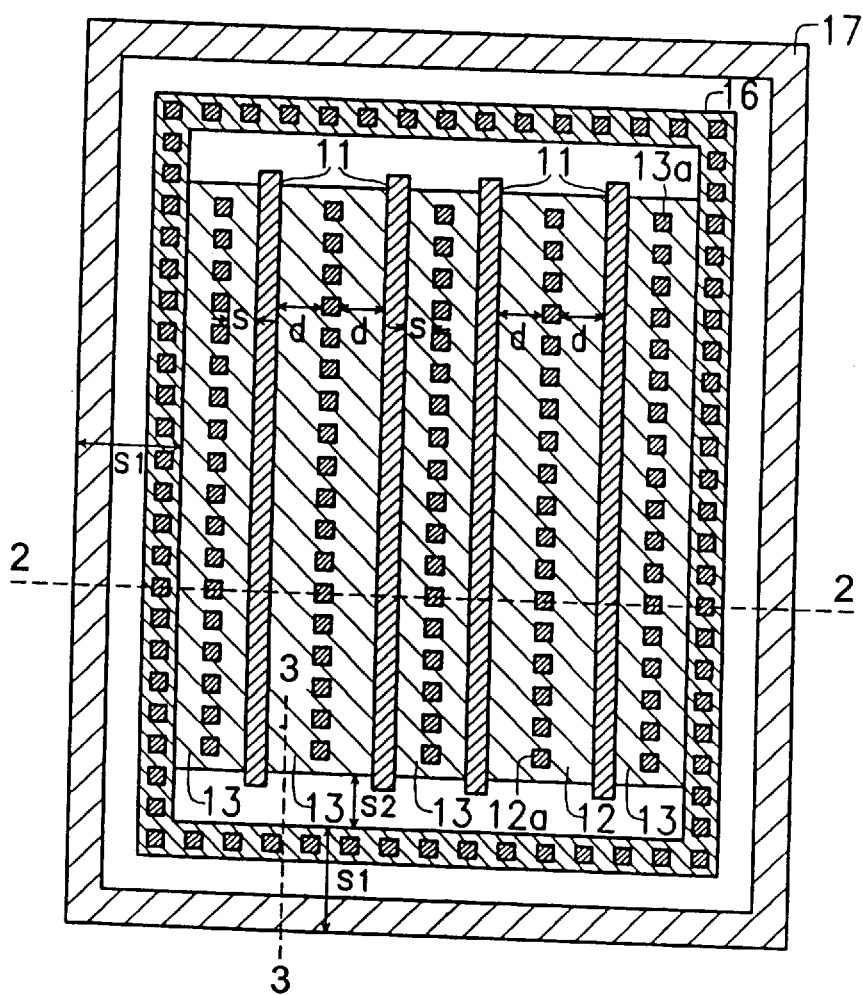
FIG. 1 is a top view of a conventional finger-type NMOS device.
Figure 2:
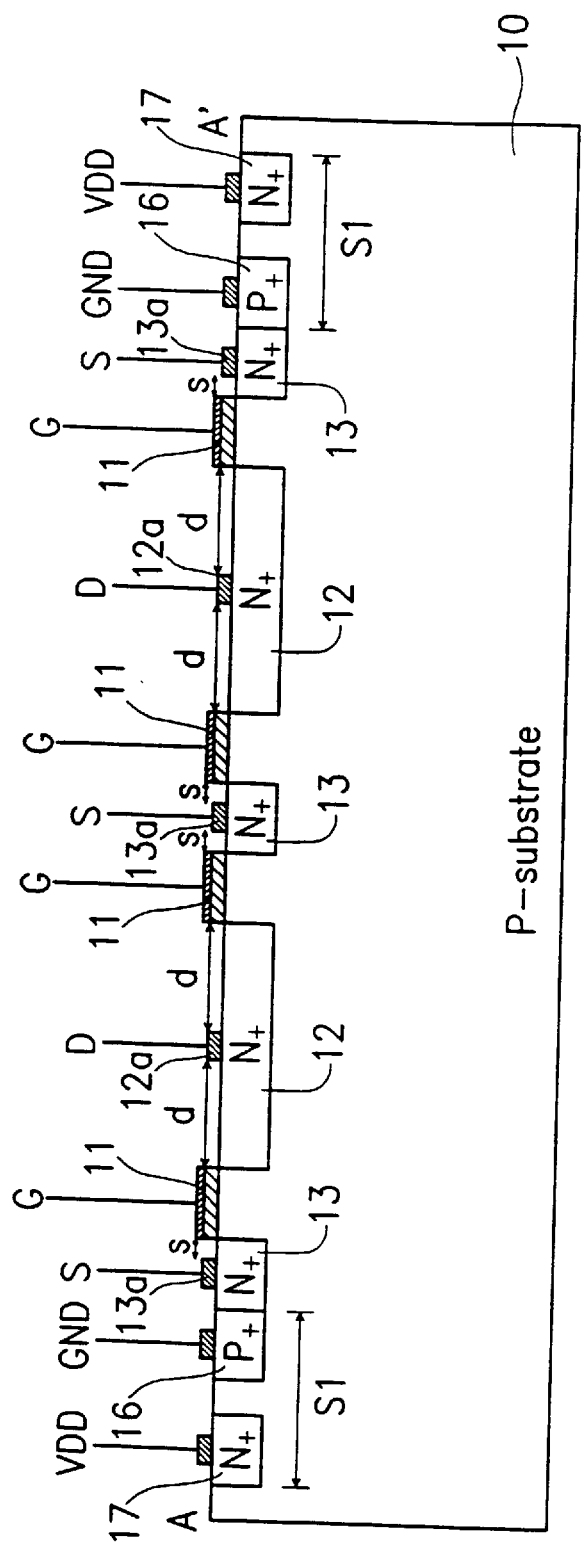
FIG. 2 is a cross-sectional view of the NMOS device along line 2—2 in FIG. 1.
Figure 3:
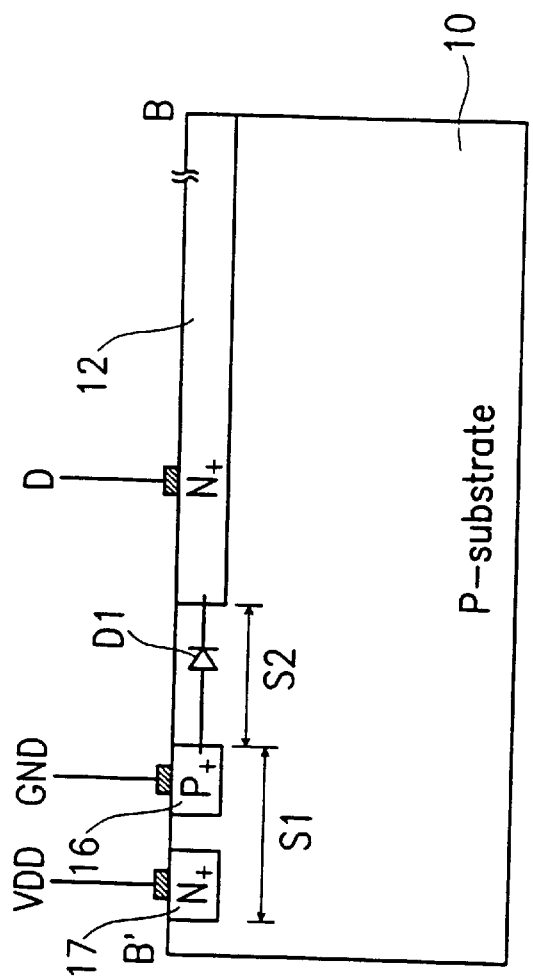
FIG. 3 is a cross-sectional view of the NMOS device along line 3—3 in FIG. 1.
Figure 4:
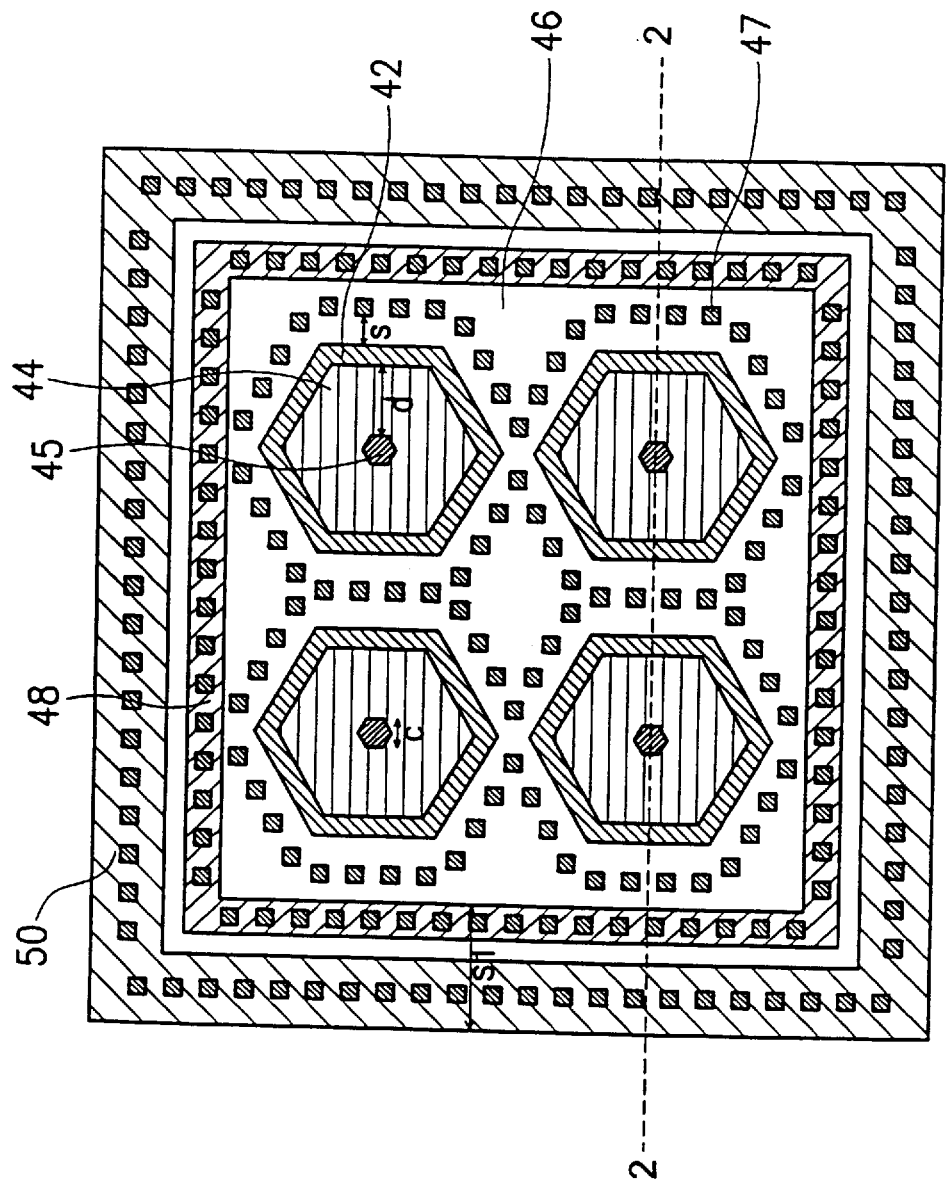
FIG. 4 is a top view of a CMOS hexagon device according to the present invention.

Referring to FIG. 4, a CMOS hexagon device according to the preferred embodiment of the present invention is illustrated. Since the n-well/p-substrate CMOS process is utilized to form the CMOS hexagon device, the cross-sectional view along line 2—2 conforms substantially with the structure illustrated in FIG. 2. However, the structure can be fabricated by any other processes, such as CMOS or BiCMOS technologies including p-well/n-substrate, n-well/p-substrate, or twin-well (or twin-tub) processes.

The CMOS hexagon device in FIG. 4 consists of four identical hexagon cells over a semiconductor substrate. That is, the four hexagon cells have the same size, shape and structure. Each hexagon cell has a hexagonal ring gate 42, which includes a conducting portion and a dielectric layer deployed over the substrate. The conducting portion consists of conducting materials, such as polysilicon. The region enclosed by each hexagonal ring gate 42 is a drain region 44. Drain regions 44 are n-type diffusion regions if the substrate is a p-type substrate. A hexagon drain contact 45 is formed over the center of each drain region 44. The contact width, i.e., the distance between parallel sides of each hexagon drain contact 45, is c. Since drain contact 45 and ring gate 42 are concentric, the shortest distance from drain contact 45 to ring gate 42 is the spacing between parallel drain contact edges and gate edges, as is denoted by d in FIG. 4. Each ring gate 42 is surrounded by a source region 46, which is an n-type diffusion region if the substrate is p-type. Through charge induction by applying an electrical voltage on the conducting portion of ring gate 42, a channel region can be formed under ring gate 42 in the substrate, thus electrically connecting drain region 44 and source region 46. Moreover, in order to uniformly distribute the current flowing from source regions 44 to drain regions 46, a number of source contacts 47 are arranged in a hexagonal pattern around each ring gate 42 and over source regions 46.

Referring to FIG. 4, the four hexagon cells are surrounded by two guard rings 48 and 50. If the hexagon device is an NMOS device in a p-type substrate, first guard ring 48 can be a heavily-doped p-type diffusion region in the substrate, and second guard ring 50 is a heavily-doped n-type diffusion region. P-type first guard ring 48, which is grounded through a number of contacts thereon, biases the p-type substrate. Latchup is prevented by applying a voltage VDD to a number of contacts formed over and connected to second guard ring 50. Alternatively, if the hexagon device is a PMOS device (i.e., the substrate is an n-type semiconductor substrate), source region 46 and drain region 44 should be p-type diffusion regions, first guard ring 48 is an n-type diffusion region, and second guard ring 50 is a p-type diffusion region.

All layout elements in the aforementioned hexagon cells, including the contact configurations, should be made as symmetrically as possible to ensure uniform current flow in the NMOS hexagon device, so as to increase the ESD protection capability. Since the S2 spacing of the finger-type layout does not exist in CMOS hexagon device of the present invention, the layout area of the hexagon device can be reduced. Moreover, because no parasitic diode D1 exists in the CMOS hexagon device, the ESD robustness of the device as an output buffer is increased.

In order to verify the advantages of the present invention, measurements of the CMOS hexagon devices and the conventional finger-type devices are compared.

Figure 5:
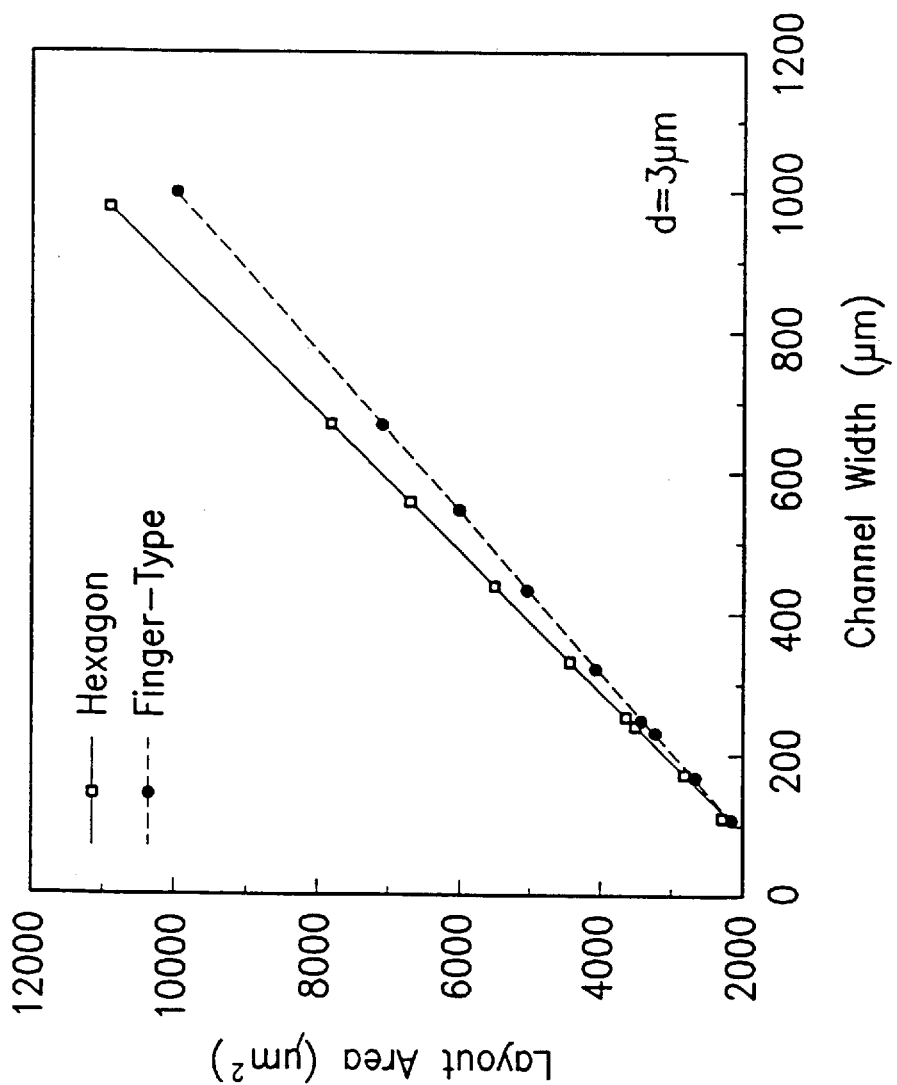
FIG. 5 is a graph illustrating the layout area as a function of device width for a conventional finger-type layout and a hexagon-type layout where spacing d is equal to 3 $\mu$m.
Figure 6:
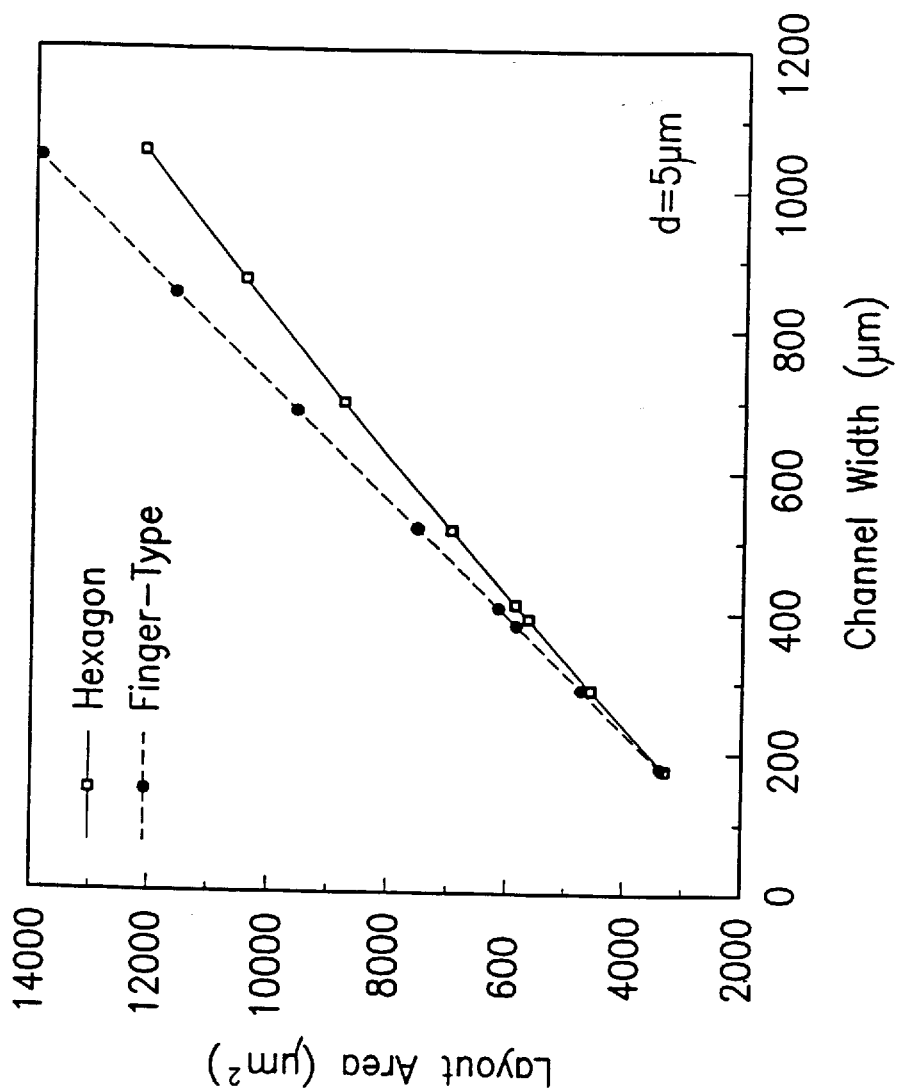
FIG. 6 is a graph illustrating the layout area as a function of device width for a conventional finger-type layout and a hexagon-type layout where spacing d is equal to 5 $\mu$m.
Figure 7:
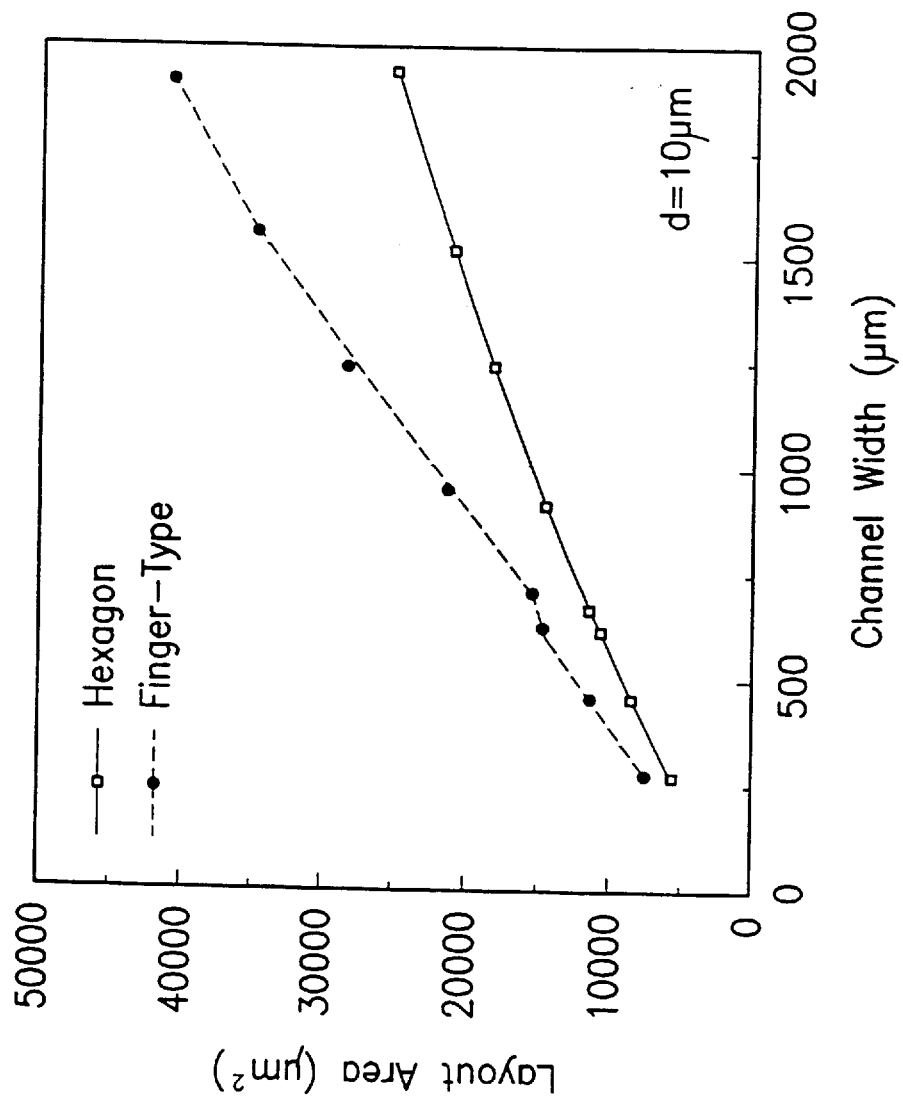
FIG. 7 is a graph illustrating the layout area as a function of device width for a conventional finger-type layout and a hexagon-type layout where spacing d is equal to 10 $\mu$m.

Referring to the graphs of FIG. 5 through FIG. 7, the layout areas are compared for different parameters d. In these figures, square symbols represent the layout area of hexagon devices, and circle symbols represent finger-type devices. All the hexagon devices and the finger-type devices have a guard ring spacing S1 of 10 $\mu$m. The drain contact width of the hexagon devices, i.e., parameter c, is 2 $\mu$m. Spacing S2 of the finger-type devices is 4 $\mu$m. All of the fingers in the finger-type devices have a constant length of about 25 $\mu$m to 50 $\mu$m. Moreover, all of the devices have a device length of 0.8 $\mu$m.

Referring to FIG. 5, when the distance (d) from the drain contact edge to the gate edge equals 3 $\mu$m, the layout areas of the finger-type devices are smaller than those of hexagon devices. However, referring to FIG. 6 and FIG. 7, as the value of parameter d increases, the areas of the hexagon devices decrease in comparison to the finger-type devices.

In FIG. 6, parameter d is 5 $\mu$m which conforms to most submicron CMOS design rules. In this case, the required layout areas of hexagon devices are significantly reduced as compared to those of finger-type devices. For the same device dimensions, for instance, where the channel width to length ratio (W/L) is 840/0.8 ($\mu$m), the total area of the finger-type device is 11484 $\mu m^2$, while that of the hexagon device is only 10296 $\mu m^2$. That is, the hexagon device requires about 11% less total layout area than that of the finger-type device.

Further referring to FIG. 7, as parameter d increases to 10 $\mu$m, the reduction of layout area for the hexagon devices is even more apparent. For example, when device dimension (W/L) is 912/0.8 ($\mu$m), the total layout area of the finger-type device is about 22455 $\mu m^2$, while that of hexagon device is only 14600 $\mu m^2$. In other words, the total layout area of the hexagon device is only 65% of that required by the finger-type device.

Figure 8:
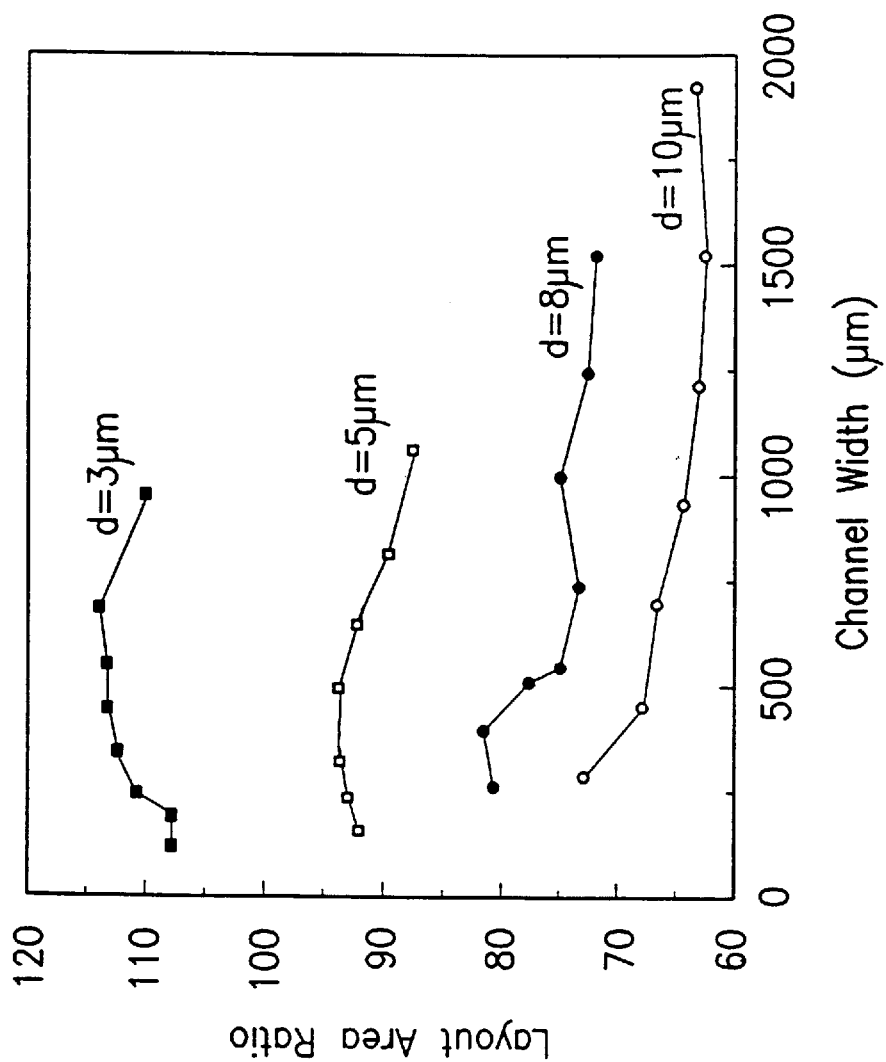
FIG. 8 is a graph illustrating the relationship between hexagon-to-finger layout area ratio and the device width for different values of layout parameter d.

FIG. 8 illustrates layout area ratio as a function of device channel width W for various of parameter d. The layout area ratio represents the layout area required for a finger-type device relative to the layout area required for a hexagon device. In particular, the layout area ratio is shown comparing values of d of 3 $\mu$m, 5 $\mu$m, 8 $\mu$m, and 10 $\mu$m. As shown in the figure, the hexagon devices have smaller layout areas compared with finger-type devices as parameter d or channel width W increases. This comparison reveals the excellent advantage of area reduction in the present invention, thus reducing the cost of CMOS ICs as the submicron CMOS technologies are utilized.

Figure 9:
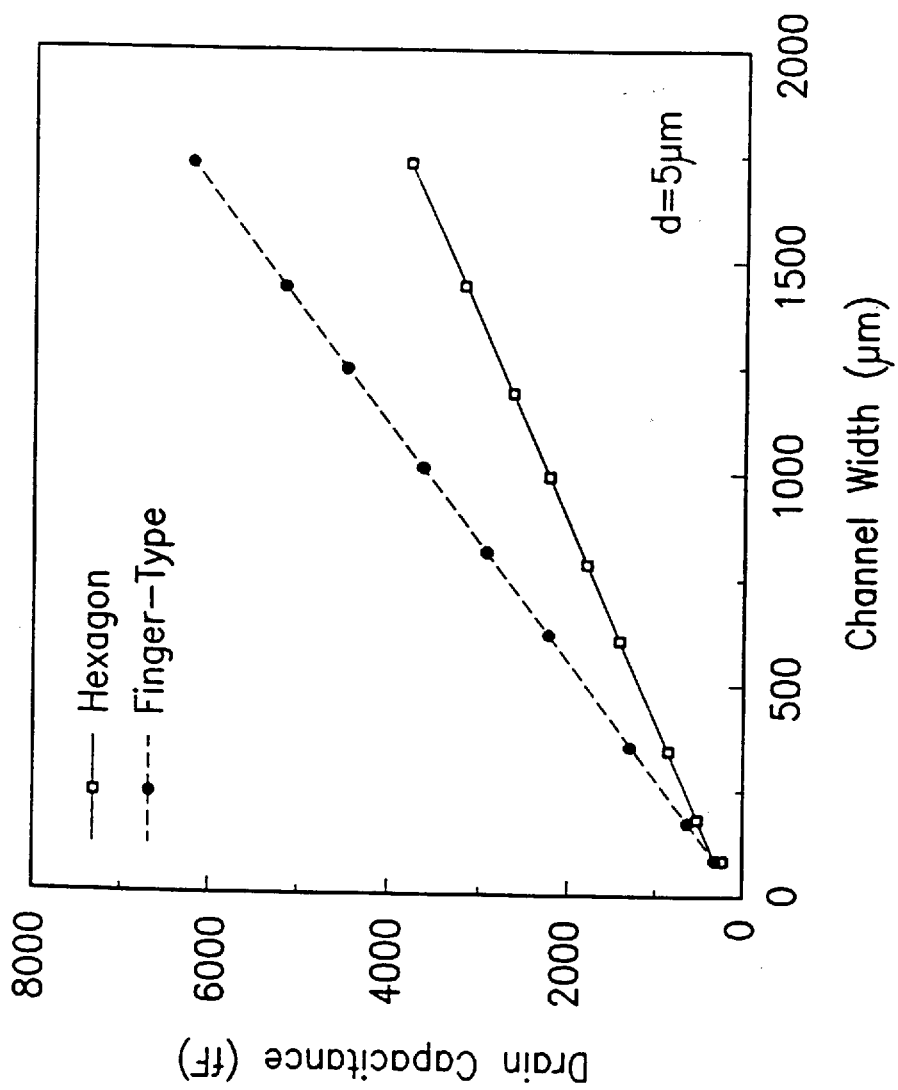
FIG. 9 is a graph illustrating the drain capacitance as a function of device width for a conventional finger-type layout and a hexagon-type layout where spacing d is equal to 5 $\mu$m.
Figure 10:
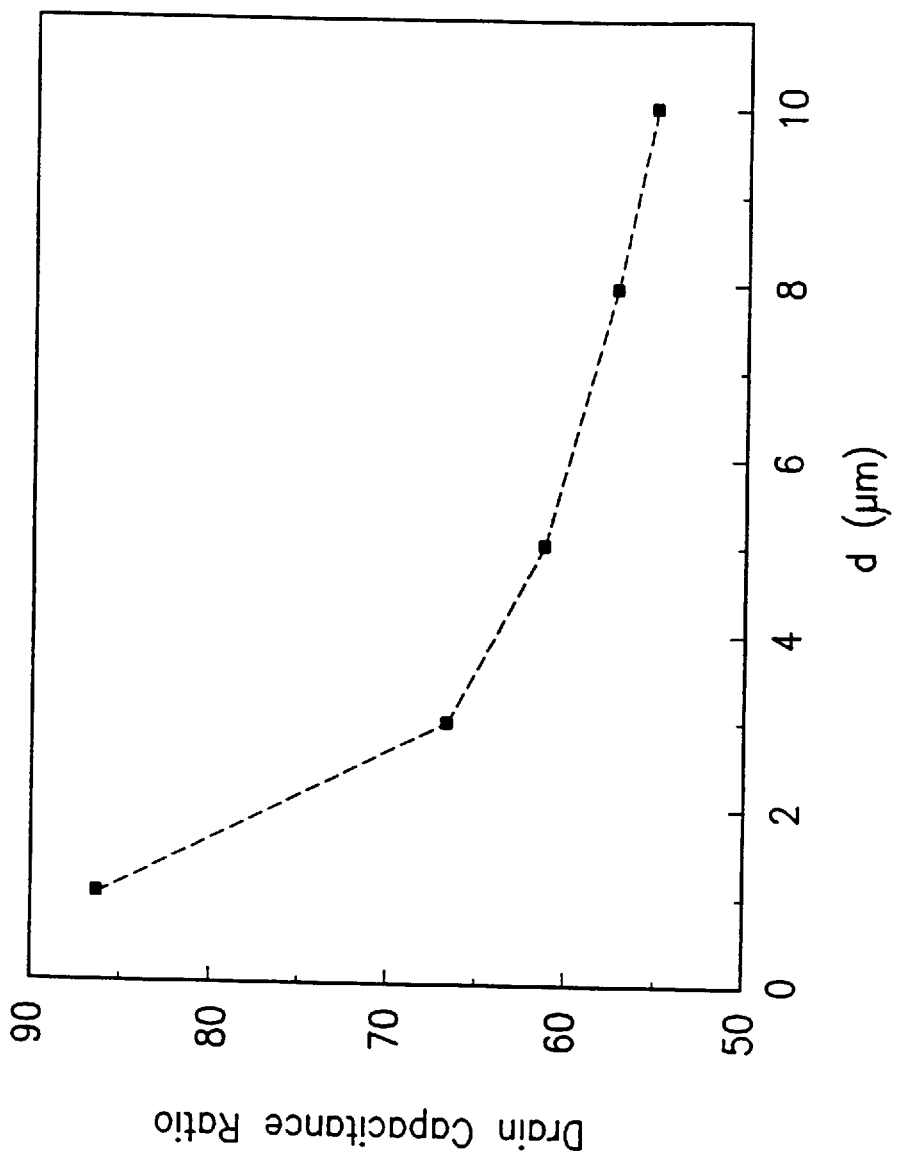
FIG. 10 is a graph illustrating the relationship between hexagon-to-finger drain capacitance ratio and spacing d.

The drain capacitances of the hexagon devices and finger-type devices are also measured and compared. Referring to FIG. 9, the drain capacitance as a function of device channel width W for hexagon devices and finger-type devices given a constant parameter d of 5 $\mu$m is illustrated. Obviously, the drain capacitance in the hexagon device is reduced in comparison with the finger-type devices. Moreover, the reduction of the drain capacitance is more significant as parameter d increases. This tendency is made clear in FIG. 10, which illustrates the reduction in the ratio of drain capacitance for hexagon devices relative to finger-type devices, as parameter d increases.

A preferred hexagon device fabricated by a 0.6 $\mu$m twin-well/p-substrate double-poly-double-metal CMOS technology, is now compared with a conventional finger-type device fabricated by the same technology. The device dimension W/L of the hexagon device is about 504/0.8 $\mu$m, while that of the finger-type device is about 440/0.8 $\mu$m. Both devices have the same parameter d of 5 $\mu$m, and have a spacing of 1 $\mu$m from their source contact edges to the gate edges. The hexagon device consists of twelve hexagon cells. The layout areas of the two devices, including the areas of the guard rings, are compared in Table 1.

TABLE 1

|  | hexagon device | finger-type device |
| --- | --- | --- |
| device dimension (W/L) | 504/0.8 ($\mu$m) | 440/0.8 ($\mu$m) |
| layout area | 5577.4 ($\mu m^2$) | 5576.9 ($\mu m^2$) |

With the invention, a hexagon NMOS device with 15% more device channel width than that of the finger-type device can be realized. The data in Table 1 again shows that the hexagon device provides a larger device dimension to drive the electric current, with the layout area being almost the same as that of the finger-type device. Thus, the layout area of an output device can be reduced by the CMOS hexagon device of the present invention.

Figure 12:
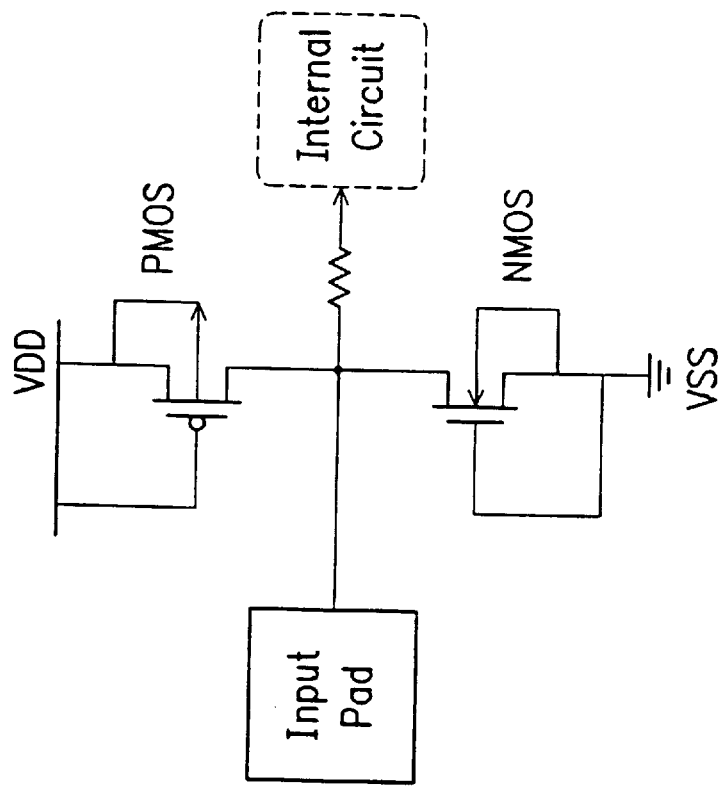
FIG. 12 is a circuit diagram of a CMOS input ESD protection circuit.
Figure 11:
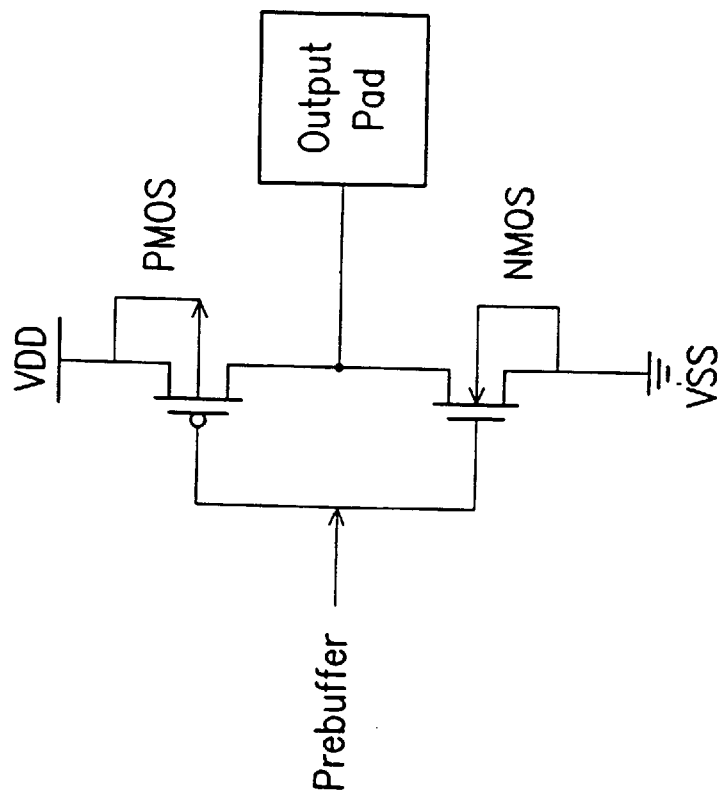
FIG. 11 is a circuit diagram of a CMOS output buffer.

Referring to FIG. 11, an NMOS hexagon device is combined with a PMOS hexagon device to serve as a CMOS output buffer. The CMOS output buffer has a small layout area but high driving capability. The present invention can also be utilized in an input ESD protection circuit. For example, when the gate of the NMOS (PMOS) in the CMOS output buffer is connected to ground (VDD), the hexagon device can provide the functions of an input ESD protection circuit, as shown in FIG. 12. Therefore, the present invention provides the following advantages.

1. The layout area of the CMOS output buffer with large-dimension thin-oxide NMOS and PMOS devices can be reduced. The layout area can be, typically, 30–40% less than the conventional finger-type layout in a 0.6 $\mu$m CMOS technology.

2. The ESD current discharging path, from drain to source of the thin-oxide NMOS and PMOS devices, is relatively uniform in each hexagon cell due to its symmetrical structure. Thus, the ESD robustness is also improved. On the other hand, in a conventional finger-type device, the non-uniform turn-on phenomenon among the fingers causes the ESD current to mainly discharge through several fingers but the other major fingers remaining off. Therefore, even devices with larger dimensions and more fingers, may have a less than acceptable ESD failure threshold because only some fingers work.

3. The present invention can be utilized as a CMOS input ESD protection circuit in order to reduce the layout area of input pins, thereby allowing an increase in the capacity of input pins in a chip.

4. With the CMOS hexagon device of the present invention, the output pins as well as the input pins of a CMOS ICs have high driving/sinking capability and high ESD protection capability within a smaller layout area.

5. The present invention can also be used as devices for internal circuits in CMOS ICs to further reduce the layout area. For example, a bus driver is often designed with large dimensions to drive the heavy load of long bus line. The devices in the bus driver can have a hexagon shape to reduce the layout area.

6. The present invention can also be applied to large-dimension devices, such as thick-oxide devices, lateral bipolar transistors, and vertical bipolar transistors, to reduce the layout area. Since the large-dimension devices can be separated into several parallel smaller devices, for example, finger-type devices, the total layout area can be reduced if the smaller devices are configured as cells with polygonal ring gates.

7. The area of the drain diffusion region in the hexagon device is smaller than that of finger-type devices. Therefore, the drain-to-bulk parasitic capacitance at the output end can be reduced in the present invention, and the operating speed can be increased.

What is claimed is:

1. A complementary metal-oxide-semiconductor (CMOS) device comprising:
a semiconductor substrate; and a plurality of MOS transistor cells, each cell including:
a hexagonal ring gate formed over the semiconductor substrate;
a drain region in the semiconductor substrate and having an outer perimeter;
a source region in the semiconductor substrate and having an inner perimeter;
a drain contact formed over and electrically contacting the center of the drain region;
a plurality of source contacts disposed around the hexagonal ring gate, the source contacts formed over and electrically contacting the source region;
a channel region under the ring gate and having a generally hexagonal ring shape, wherein the channel region has an inner side that is bounded by the outer perimeter of the drain region and it has an outer side that is bounded by the inner perimeter of the source region; and
a first guard ring surrounding the MOS transistor cells in the semiconductor substrate to which bias is applied to the semiconductor substrate, each MOS transistor cell being equally spaced from the first guard ring.

2. The CMOS device as claimed in claim 1, further comprising a dielectric layer formed over the semiconductor substrate and the hexagonal ring gate including a conducting portion formed over the dielectric layer, thereby defining a channel region connecting the source region and the drain region in the semiconductor substrate.

3. The CMOS device as claimed in claim 2, wherein the conducting portion is polysilicon.

4. The CMOS device as claimed in claim 1, wherein the drain contact has a hexagonal shape and is concentric with the hexagonal ring gate.

5. The hexagon device as claimed in claim 1, wherein the source contacts are arranged in a pattern around the hexagonal ring gate, the pattern having substantially the same hexagonal ring shape as the ring gate.

6. The CMOS deive as claimed in claim 1, further comprising:
a second guard ring surrounding the first guard ring in the semiconductor substrate.

7. The CMOS device as claimed in claim 6, wherein the semiconductor substrate is a p-type semiconductor substrate, and the source region and the drain region are n-type diffusion regions.

8. The CMOS device as claimed in claim 7, wherein the first guard ring is a p-type diffusion region and the second guard ring is an n-type diffusion region.

9. The CMOS device as claimed in claim 6, wherein the semiconductor substrate is an n-type semiconductor substrate, and the source region and the drain region are p-type diffusion regions.

10. The CMOS device as claimed in claim 9, wherein the, first guard ring is an n-type diffusion region and the second guard ring is a p-type diffusion region.

* * * * *